(12) United States Patent
Yim et al.

(10) Patent No.: US 7,201,807 B2
(45) Date of Patent: Apr. 10, 2007

(54) **METHOD FOR CLEANING A DEPOSITION CHAMBER AND DEPOSITION APPARATUS FOR PERFORMING *IN SITU* CLEANING**

(75) Inventors: Eun-Taek Yim, Gyeonggi-do (KR); Young-Wook Park, Gyeonggi-do (KR); In-Sung Park, Seoul (KR); Han-Mei Choi, Seoul (KR); Kyoung-Seok Kim, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 311 days.

(21) Appl. No.: 10/734,479

(22) Filed: Dec. 12, 2003

(65) Prior Publication Data

US 2004/0123879 A1 Jul. 1, 2004

(30) Foreign Application Priority Data

Dec. 26, 2002 (KR) ............ 10-2002-0084218

(51) Int. Cl.
*B08B 5/00* (2006.01)
*B08B 9/093* (2006.01)

(52) U.S. Cl. .................. 134/30; 134/31; 438/905
(58) Field of Classification Search ........... 134/22.1, 134/1.1, 26, 30, 31; 438/905; 216/37, 63
See application file for complete search history.

(56) References Cited

U.S. PATENT DOCUMENTS 5,647,953 A * 7/1997 Williams et al. ............ 134/1.1
5,679,215 A * 10/1997 Barnes et al. ............... 134/1.1
5,709,757 A * 1/1998 Hatano et al. ............ 134/22.14
6,082,375 A * 7/2000 Gealy et al. ............... 134/1.1
6,610,211 B1 * 8/2003 Gealy et al. ................ 216/37
6,659,111 B1 * 12/2003 Mouri et al. .............. 134/22.1

FOREIGN PATENT DOCUMENTS

| JP | 09-148255 | 6/1997 |
| JP | 11-222679 | 8/1999 |
| JP | 11222679 | 8/1999 |
| JP | 2000-143213 | 5/2000 |

OTHER PUBLICATIONS

English language abstract of Japanese Publication No. 09-148255.
English language abstract of Japanese Publication No. 11-222679.
English language abstract of Japanese Publication No. 2000-143213.
English language Abstract from Japanese Patent Publication No. JP11222679 published Aug. 17, 1999.

* cited by examiner

*Primary Examiner*—Michael Barr
*Assistant Examiner*—Saeed Chaudhry
(74) *Attorney, Agent, or Firm*—Marger Johnson & McCollom, P.C.

(57) ABSTRACT

Disclosed are a method for cleaning a deposition chamber by removing attached metal oxides, and a deposition apparatus for performing in situ cleaning. A first gas and a second gas are provided into the deposition chamber. The first gas is reacted with metal included in the metal oxide to generate reacting residues. The second gas then decomposes the reacting residues, and the decomposed residues are exhausted out of the chamber. Thus, this cleaning process can be rapidly accomplished while the deposition chamber is not opened or separated from a deposition apparatus.

21 Claims, 8 Drawing Sheets

A FLUORINE-CONTAINING GAS AND A WATER VAPOR FLOW IN A DEPOSITION CHAMBER — S10

ALUMINUM OXIDE IS REMOVED AFTER ALUMINUM OXIDE IS REACTED WITH THE FLUORIDE BASED GAS AND THE WATER VAPOR — S12

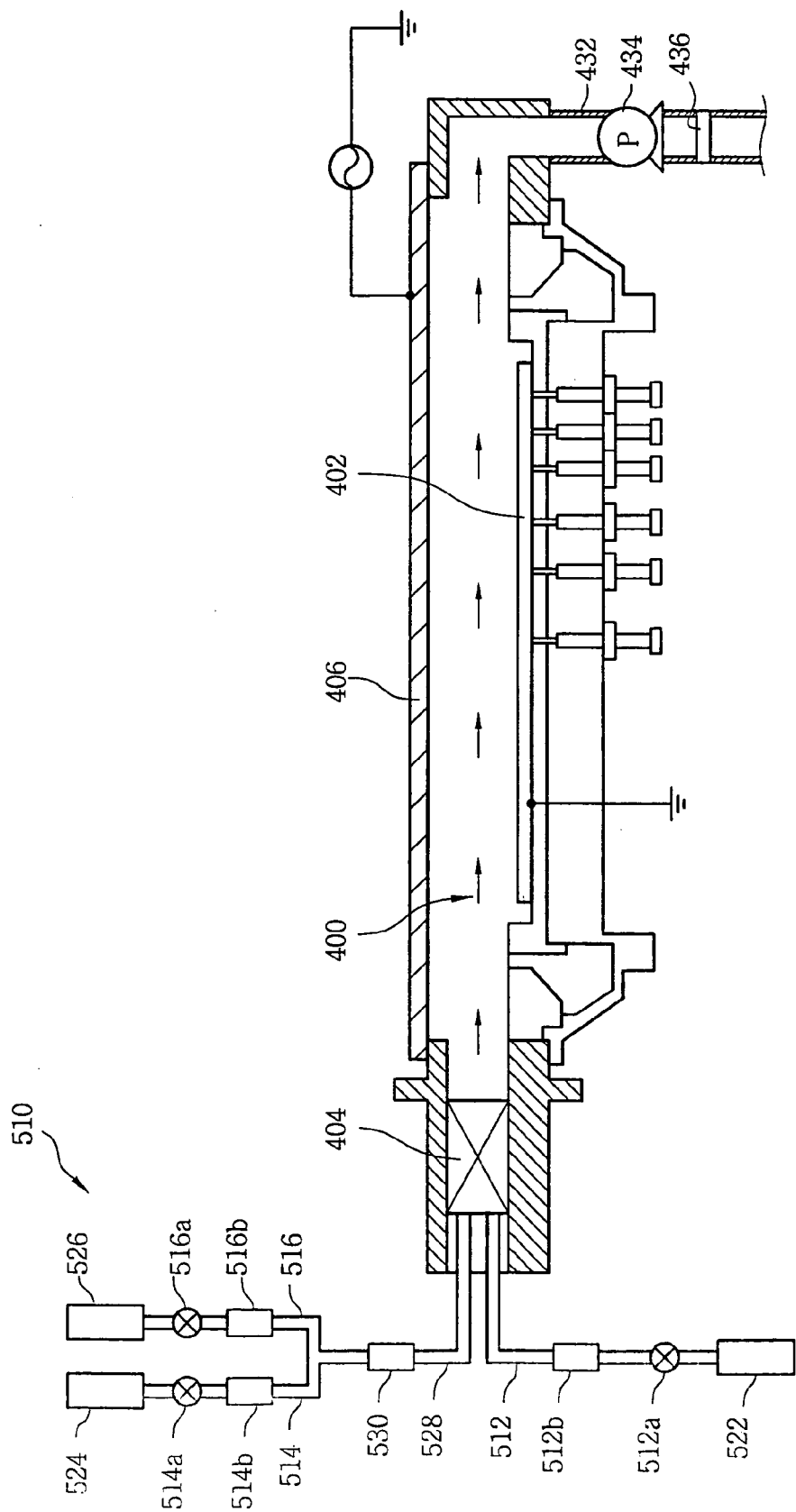

METHOD FOR CLEANING A DEPOSITION CHAMBER AND DEPOSITION APPARATUS FOR PERFORMING *IN SITU* CLEANING

CROSS REFERENCE TO RELATED APPLICATIONS

This application claims priority under 35 USC § 119 to Korean Patent Application 2002-84218, filed on Dec. 26, 2002, the contents of which are incorporated herein by reference in their entirety for all purposes.

BACKGROUND OF THE INVENTION

1. Field of the Invention

The present invention relates to a method of cleaning a deposition chamber and a deposition apparatus, and more particularly, to a method and an apparatus for cleaning metal oxides attached to elements inside of a deposition chamber.

2. Description of the Related Art

In the manufacture of semiconductor devices, a deposition process, for forming a film on a wafer, and a dry etching process are performed in a chamber maintained with high vacuum pressure. In the deposition process, deposition gases are provided into a deposition chamber with a wafer, and a film is formed on the wafer by a reaction between the deposition gases.

The film is desirably formed on a surface of the wafer for the deposition process. Reacting residues are, however, also substantially deposited on the inside of the deposition chamber including the other elements inside of the chamber. Also, reaction by-products that have not reacted with the wafer are partially attached on the inside and elements of the deposition chamber. When the thickness of the reacting residues or the reaction by-products attached in the deposition chamber becomes substantial, the reaction residues or by-products may separate from the inside and elements of the deposition chamber. As they separate from the inside and elements of the chamber, they may drop on the surface of a wafer and cause a fatal processing failure. To prevent this type of failure, a cleaning process should be performed periodically to remove the reaction residues by-products attached in the deposition chamber. The cleaning process is generally performed in situ without opening the deposition chamber or separating the deposition chamber from a deposition apparatus.

Recently, various thin films have been required for manufacturing a semiconductor device, thus leaving various kinds of reacting residues and reaction by-products. However, these residues and by-products generated during the formation of specific thin films may be hard to remove using a conventional process for in situ cleaning the deposition chamber. In fact, deposition processes for some specific thin films have been developed that lack an efficient process for in situ cleaning the deposition chamber where they are deposited. As a result, the deposition process for these specific films may not be able to be efficiently employed in a semiconductor manufacturing process. For example, an aluminum oxide (Al2O3) film is used as a dielectric film of a capacitor or a gate insulation film because the aluminum oxide film has a dielectric constant higher than that of a conventional silicon oxide film. However, reacting residues or reaction by-products are generated in its deposition process and are attached in the deposition chamber during the formation of the aluminum oxide film. The cleaning time for the deposition chamber may greatly increase because the reacting residues or the reaction by-products cannot efficiently be removed using conventional cleaning processes, because the etching rates of these residues and by-products are very low.

A method for cleaning a deposition chamber for an aluminum oxide film is disclosed in Japanese Patent Laid Open Publication No. 11-222679. According the Japanese Patent Laid Open Publication, a hydrogen fluoride (HF) gas is provided into the deposition chamber in order to remove aluminum oxides deposited in the deposition chamber. The HF gas is reacted with the aluminum oxide to generate solid-phased aluminum fluoride ($AlF_3$) on a surface of the aluminum oxide. However, when the solid-phased aluminum fluoride is formed on the surface of the aluminum oxide, the deposition chamber may not be efficiently cleaned because aluminum oxide film beneath the aluminum fluoride cannot easily removed with a dry etching process.

SUMMARY OF THE INVENTION

In order to overcome above-mentioned problems, a method for cleaning a deposition chamber in which metal oxides are attached is provided as a feature of the present invention.

It is another feature of the present invention to provide a method for cleaning a deposition chamber with, for example, aluminum oxide ($Al_2O_3$) attached therein.

It is yet another feature of the present invention to provide a deposition apparatus for performing in situ cleaning.

In accordance with one aspect of the present invention, a first gas and a second gas are introduced into a deposition chamber with a metal oxide attached therein. In this case, the first gas is reacted with a metal in the metal oxide to generate a reacting residue and the second gas decomposes this reacting residue. Thus, the metal oxide can be removed from the deposition chamber by reacting the metal oxide with the first gas and the second gas.

In accordance with another aspect of the present invention, a fluorine-containing gas and a water vapor are introduced into a deposition chamber including an aluminum oxide attached therein. Here, the fluorine-containing gas is reacted with the aluminum in the aluminum oxide to generate reacting residues, and the water vapor decomposes the reacting residues. In addition, at least one of these two cleaning agents can be continuously introduced into the deposition chamber during the cleaning process. Thus, the aluminum oxide can also be removed from the deposition chamber by reacting the aluminum oxide with the fluorine-containing gas and the water vapor.

In accordance with still another aspect of the present invention, a fluorine-containing gas and a water vapor are alternatively provided to a deposition chamber with an aluminum oxide attached therein. Here, the fluorine-containing gas is reacted with the aluminum in the aluminum oxide to generate reacting residues, and the water vapor decomposes the reacting residues.

The deposition apparatus of an embodiment of the present invention includes a deposition chamber, a wafer chuck for loading a wafer, a gas supply member having a deposition gas supply line and cleaning gas supply lines, a plasma generating member, and an exhaust member. The wafer chuck is disposed in the deposition chamber. The deposition gas supply line provides a deposition gas into the deposition chamber, and the cleaning gas supply lines, which are extended into the deposition chamber, provide cleaning gases into the deposition chamber. The plasma generating member excites gases provided through the gas supply member to generate plasmas, and the exhaust member pumps out the reacting residues generated in the deposition chamber.

According to still another aspect of the present invention, the deposition apparatus of another embodiment includes a deposition chamber, a wafer chuck for loading a wafer, a gas supply member having a deposition gas supply line and cleaning gas supply lines, a plasma generating member, and an exhaust member. In this embodiment, the cleaning gas supply lines are integrated to provide mixed cleaning gases into the deposition chamber.

According to this embodiment, metal oxides attached in the deposition chamber are reacted with the first gas to generate solid-phased residues. Then, the solid-phased residues are decomposed using a second gas. Therefore, the metal oxides in the deposition chamber are rapidly etched to clean the deposition chamber in a comparatively short time. This method for cleaning a deposition chamber including metal oxides attached therein will now be described in detail.

A first gas and a second gas are introduced into the deposition chamber with the metal oxides deposits. The first gas reacts with the metal in the metal oxides to generate reacting residues. The second gas then decomposes these reacting residues. The first gas can include a fluorine-containing gas, such as a hydrogen fluoride (HF) gas, a fluorine ($F_2$) gas, or a sulfur hexafluoride ($SF_6$) gas. The second gas can include water ($H_2O$) vapor.

After the first gas is reacted with the metal oxides to generate the reacting residues and the second gas decomposes the reacting residues, the decomposed reacting residues are exhausted from the deposition chamber by pumping the deposition chamber. Here, the first and second gases can be provided into the deposition chamber in accordance with various methods. For example, the first and second gases can be concurrently introduced into the deposition chamber. Additionally, the first gas may be continually provided to the deposition chamber, while the second gas is only periodically introduced. Conversely, while the second gas is provided into the deposition chamber, the first gas may be periodically introduced into the deposition chamber. In addition, the first and second gases can be alternatively provided into the deposition chamber.

The etching rate of the metal oxide in the deposition chamber can depend upon the method of providing the first and second gases. Hence, the cleaning rate of the deposition chamber can be adjusted by controlling the method of providing the first and second gases or the flow rates of the first and second gases. An additional gas, including at least one gas selected of a nitric acid ($HNO_3$) gas and an alcohol-containing gas, can be provided into the deposition chamber. The deposition chamber has a temperature of about 50 to about 650° C., and a pressure of about 0.1 to about 100 Torr.

The gases that have been introduced into the deposition chamber can be excited in the deposition chamber by a radio frequency plasma process. Alternatively, the gases can be excited outside the deposition chamber by a remote plasma process before the gases are introduced into the deposition chamber.

Furthermore, the first and second gases can be separately provided into the deposition chamber through different gas supply lines, or in the alternative, the first and second gases can be mixed in one gas supply line to be provided into the deposition chamber.

According to the above-described method, the metal oxides deposited in the deposition chamber are continuously reacted and quickly decomposed, thereby rapidly removing the metal oxides from the deposition chamber. Therefore, the deposition chamber, including the metal oxides attached therein, is cleaned in situ without opening the deposition chamber or separating the deposition chamber from the deposition apparatus.

BRIEF DESCRIPTION OF THE DRAWINGS

The above and other advantages of the present invention will become more apparently by describing in detail embodiments of the present inventive idea with references to the accompanying drawings, in which:

FIG. 10 is a schematic cross-sectional view illustrating a gas flow type deposition apparatus according to still another embodiment of the present invention.

DETAILED DESCRIPTION OF THE PREFERRED EMBODIMENTS

Figure 1:
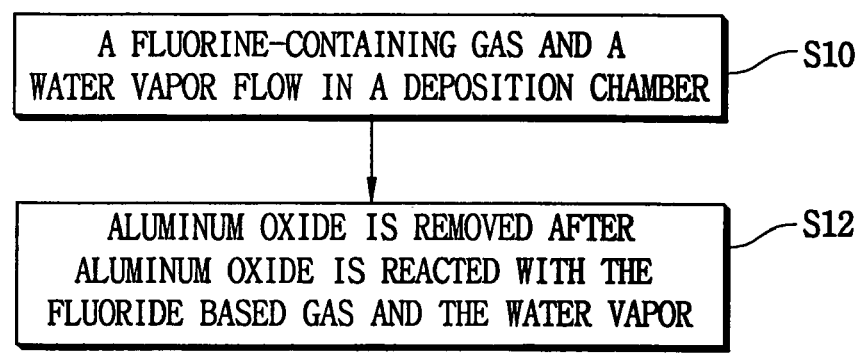
FIG. 1 is a flow chart illustrating a method for cleaning a deposition chamber according to a first embodiment of the present invention.

Hereinafter, embodiments of the present invention will be described in detail with reference to the accompanying drawings. In the drawings, like reference numerals identify similar or identical elements.

Embodiment 1

Figure 2:
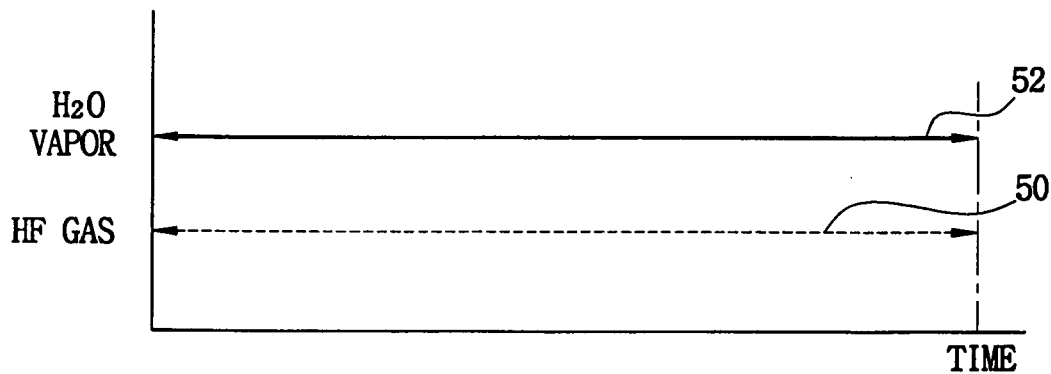
FIG. 2 is a graph illustrating flow rates of a fluorine-containing gas and water vapor that flow into the deposition chamber during the method in FIG. 1.

FIG. 1 is a flow chart illustrating a method for cleaning a deposition chamber according to a first embodiment of the present invention, and FIG. 2 is a graph illustrating flow rates of a fluorine-containing gas and water vapor that flow into the deposition chamber during the method in FIG. 1.

The deposition chamber to be cleaned is installed in a deposition apparatus in order to form an aluminum oxide ($Al_2O_3$) film that can, for example, be a dielectric film in a capacitor or a gate insulation film. During formation of the aluminum oxide film, materials including aluminum oxide are attached on an inside of the deposition chamber and on several elements of the deposition chamber.

Referring to FIG. 1, a fluorine-containing gas and water vapor concurrently flow in the deposition chamber (step S10). The fluorine-containing gas is reacted with the aluminum oxide to generate a residue, and the water vapor decomposes this residue. Examples of the fluorine-containing gas include a hydrogen fluoride (HF) gas, a fluorine ($F_2$) gas, a sulfur hexafluoride ($SF_6$) gas, etc. These gases may be used alone or in combination. In the present embodiment, the fluorine-containing gas may be a HF gas.

As shown in FIG. 2, the HF gas 50 and the water vapor 52 are introduced into the deposition chamber for a predetermined time period in order to sufficiently clean the deposition chamber. In this case, the flow rate of the HF gas 50 is between about 100 sccm and about 1,000 sccm, and a flow rate of the water vapor is between about 100 sccm and about 1,000 sccm. Though the ratio between the HF gas and the water vapor may be varied as conditions demand, the flow rate of the water vapor 52 should be approximately equal to that of the HF gas 50 in order to prevent a back ward flow of the gases from the deposition chamber to a gas supply line.

The HF gas 50 and the water vapor 52 can be supplied into the deposition chamber through different gas supply lines, respectively. Alternatively, a mixture of the HF gas 50 and the water vapor 52 can be supplied into the deposition chamber after the HF gas 50 is mixed with the water vapor 52 in an integrated gas supply line.

During the cleaning process, the deposition chamber can have a temperature of about 25 to about 650° C. However, the deposition chamber preferably has a temperature that is between 150° C. lower than the film deposition temperature to a temperature approximately equal to the film deposition temperature when the film is formed in the deposition chamber. Here, the deposition temperature for the film is usually between about 200 to about 250° C. If the cleaning process has a temperature much lower than the film deposition temperature, the time for lowering and raising the temperature of the deposition chamber may greatly increase the processing time necessary for in situ cleaning after the deposition process.

The deposition chamber cleaning process can also be performed at a pressure of about 0.1 to about 100 Torr. Preferably, during the cleaning process the deposition chamber has a pressure that is higher than a film deposition pressure during the deposition process. In this case, the deposition pressure for the film is between about 0.1 and about 10 Torr. When the deposition chamber has a pressure that is much lower than the deposition pressure for the film, an etching rate of the aluminum oxide may decrease because the gases flowing into the deposition chamber may be exhausted from the deposition chamber before the gases are reacted with the aluminum oxide attached on the inside of the deposition chamber.

An additional gas can also be introduced into the deposition chamber besides the HF gas 50 and the water vapor 52. The additional gas may include at least one selected from a nitric acid ($HNO_3$) gas and an alcohol-containing gas. The additional gas is diluted with the HF gas 50 and the water vapor 52 for etching the aluminum oxide so that the etching rate of the aluminum oxide attached on the inside of the deposition chamber is reduced. This allows an operator to adequately adjust the etching rate of the aluminum oxide. By reducing the etching rate of the aluminum oxide, damage to the inside and elements of the deposition chamber can be reduced from the otherwise very rapid etching process.

After the HF gas 50 and the water vapor 52 flowing into the deposition chamber have reacted with and decomposed the aluminum oxide attached on the inside of the deposition chamber to form reacting residues, the aluminum oxide is removed from the deposition chamber by pumping out the reacting residues (step S12).

The reaction between the aluminum oxide and the etching gases introduced into the deposition chamber will now be described in more detail.

Figure 3A:
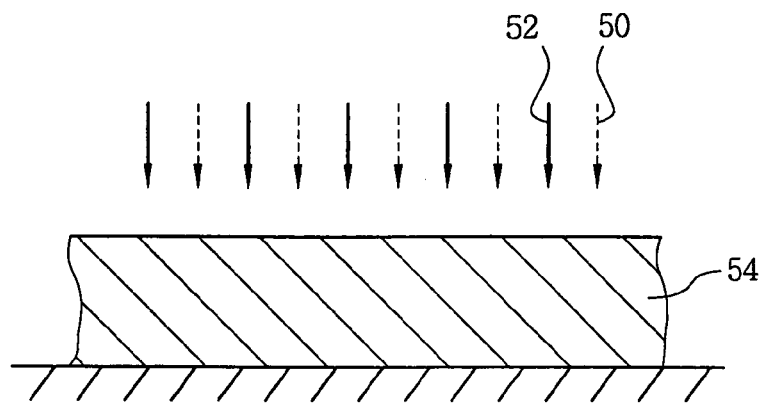
FIGS. 3A to 3C are cross-sectional view diagrams illustrating steps for removing aluminum oxide according to the present invention.
Figure 3B:
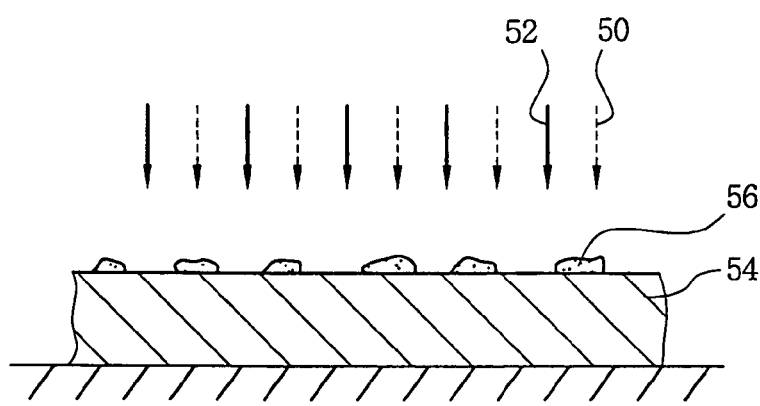
Figure 3C:
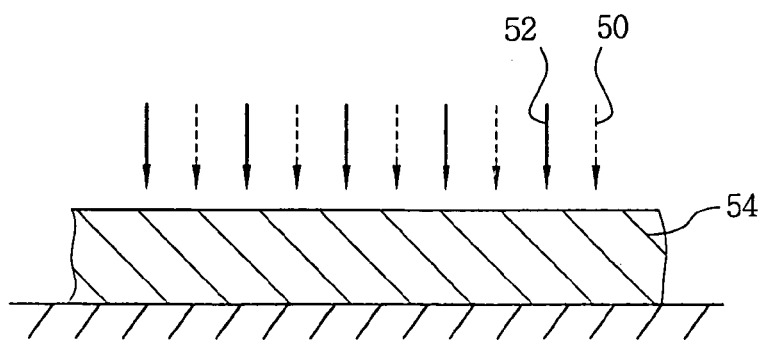

FIGS. 3A to 3C are cross-sectional view diagrams illustrating steps for removing aluminum oxide according to the present invention.

Referring to FIGS. 3A and 3B, the aluminum oxide 54 attached on the inside of the deposition chamber is reacted with the HF gas 50 to generate aluminum fluoride ($AlF_3$) 56, which has a solid phase, on a surface of the aluminum oxide 54a. Though solid-phased aluminum fluoride 56 is desirably exhausted from the deposition chamber, most of the aluminum fluoride 56 remains on the surface of the aluminum oxide 54a. However, because the solid-phased aluminum fluoride 56 is soluble, the aluminum fluoride 56 can be rapidly decomposed by the water vapor 52 that is introduced into the deposition chamber with the HF gas 50.

Referring to FIG. 3C, the aluminum fluoride 56 decomposed by the water vapor 52 is separated from the surface of the aluminum oxide 54a, and is exhausted from the deposition chamber by a pumping process. Thus, when the HF gas 50 and the water vapor 52 are concurrently provided into the deposition chamber, several steps are repeatedly performed in the deposition chamber to rapidly remove the aluminum oxide 54 attached in the deposition chamber, including:

a step of generating the aluminum fluoride 56 by reacting the aluminum oxide 54 with the HF gas 50;

a step of decomposing the generated aluminum fluoride 56 by the water vapor 52; and a step of exhausting the decomposed aluminum fluoride 56 from the deposition chamber.

With various experiments, it has been found that the aluminum oxide attached in the deposition chamber can be removed from the deposition chamber by an etching rate of about 300 to about 1,000 Å/mimute.

Etching modes of the aluminum oxide can be changed by varying the etching rate of the aluminum oxide and allowing a risk of some damage to the deposition chamber from the etching process. For example, the aluminum oxide can be etched using a radio frequency (RF) plasma process, a remote plasma process, or a thermal process.

In the RF plasma process, etching gases are excited in a deposition chamber to generate plasmas of the etching gases. Thus, an etching efficiency of the RF plasma process is relatively high because the object is etched using the plasmas of the etching gases. However, this process runs a risk of damaging the inside or elements of the deposition chamber due to the plasmas of the etching gases.

As for the remote plasma process, etching gases are excited in a remote plasma generator separately disposed from a deposition chamber, and the excited etching gases are introduced into the deposition chamber. Because decomposed molecules of the etching gases have short life times and the plasmas of the etching gases are generated outside of the deposition chamber, the etching efficiency of the remote plasma process can be relatively lower than that of the RF plasma process. However, the inside and elements of the deposition chamber run a significantly lower risk of being damaged.

In the thermal process, plasmas of the etching gases are not generated in the deposition chamber. An object is merely etched by using thermal energy generated by heating the deposition chamber. Thus, the etching efficiency of the thermal process is lower still than either that of the RF plasma process or the remote plasma process, but the inside or elements of the deposition chamber cannot be damaged during etching the object. Thus, there are several options when employing the above-described processes for cleaning the deposition chamber including the aluminum oxide attached therein.

Embodiment 2

Figure 4:
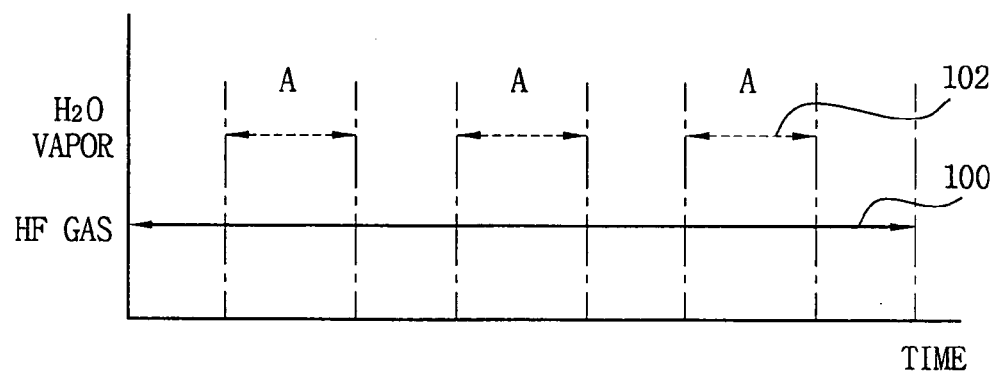
FIG. 4 is a graph illustrating flow rates of a fluorine-containing gas and water vapor that flow into a deposition chamber during a method for cleaning the deposition chamber according to a second embodiment of the present invention.

FIG. 4 is a graph illustrating flow rates of a fluorine-containing gas and water vapor that flows into a deposition chamber during a method for cleaning the deposition chamber according to a second embodiment of the present invention.

Referring to FIG. 4, a fluorine-containing gas is continuously introduced into a deposition chamber for a predetermined time period in response to a material, including aluminum oxide ($Al_2O_3$), being deposited on the inside and elements of a deposition chamber. The fluorine-containing gas can include a hydrogen fluoride (HF) gas, a fluorine ($F_2$) gas, or a sulfur hexafluoride ($SF_6$) gas. This embodiment will describe the fluorine-containing gas as an HF gas 100, however, any of the above mentioned gases may be used.

Additionally in this embodiment, water vapor 102 is periodically introduced into the deposition chamber while the HF gas 100 is continuously introduced into the deposition chamber. Therefore, the HF gas 100 and the water vapor 102 are concurrently provided into the deposition chamber for time increments of 'A' in FIG. 4.

The material including the aluminum oxide is etched by being reacted with the continuously introduced HF gas 100 so that aluminum fluoride ($AlF_3$) is generated in the deposition chamber. The aluminum fluoride that is formed on the surface of the aluminum oxide has a solid phase and is desirably exhausted from the deposition chamber. However, the majority of the aluminum fluoride is not removed by this process and remains on the surface of the aluminum oxide. Therefore, since aluminum fluoride is rapidly decomposed by water vapor, water vapor 102 is periodically introduced into the deposition chamber during the introduction of the HF gas 100. The decomposed aluminum fluoride is then separated from the aluminum oxide by a pumping process, and is exhausted outside the deposition chamber.

In the present embodiment, the processes described above are repeatedly performed in the deposition chamber until the chamber is cleaned. That is, a process of generating the aluminum fluoride by reacting the aluminum oxide with the HF gas 100, a process of decomposing the generated aluminum fluoride by the water vapor 102, and a process of exhausting the decomposed aluminum fluoride from the deposition chamber are repeatedly performed. However, the process of decomposing the generated aluminum fluoride is only periodically performed in the deposition chamber when the water vapor 102 is provided. In the present embodiment, an etching rate of the aluminum oxide may be relatively lower than that of the first embodiment. However, the etching rate of the aluminum oxide can be adjusted by controlling a flow time of the water vapor 102 and a flow period of the water vapor 102.

Embodiment 3

Figure 5:
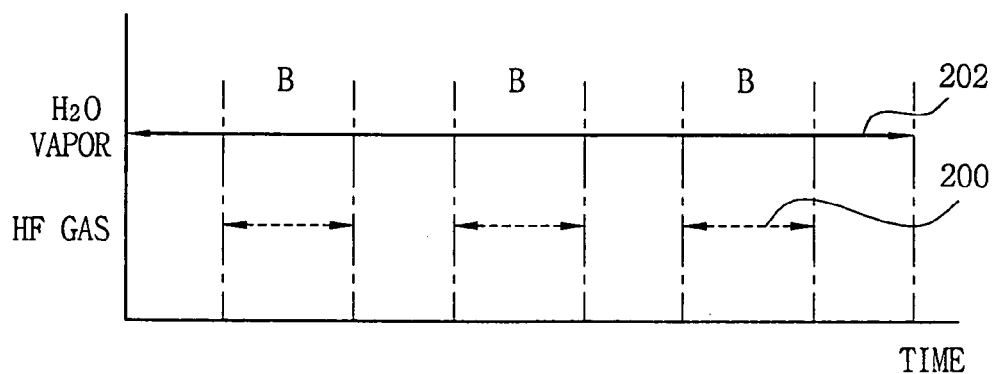
FIG. 5 is a graph illustrating flow rates of a fluorine-containing gas and water vapor that flow into a deposition chamber during a method for cleaning the deposition chamber according to a third embodiment of the present invention.

FIG. 5 is a graph illustrating flow rates of a fluorine-containing gas and a water vapor that flow into a deposition chamber during a method for cleaning the deposition chamber according to a third embodiment of the present invention.

Referring to FIG. 5, a water vapor 202 is continuously introduced into a deposition chamber for a predetermined time, and a fluorine-containing gas is periodically provided into the deposition chamber while the water vapor 202 is introduced to react with and decompose a material including aluminum oxide that is attached on an inside or elements of the deposition chamber.

Examples of the fluorine-containing gas include a HF gas, an $F_2$ gas, an $SF_6$ gas and so on. This embodiment will be explained with the fluorine-containing gas as an HF gas 200, however, any of the above mentioned gases or other suitable fluorine-containing gas might be used. In this embodiment, the HF gas 200 and the water vapor 202 are concurrently provided into the deposition chamber for the time increments of 'B' in FIG. 5.

The aluminum oxide, which is periodically introduced into the deposition chamber, is reacted with the HF gas 200 to generate aluminum fluoride. The aluminum fluoride is then decomposed by the water vapor 202, which is continuously introduced into the deposition chamber. The decomposed aluminum fluoride is exhausted from the deposition chamber by a pumping process to clean the deposition chamber.

According to the present embodiment, an etching rate of the aluminum oxide is lower than that of the first embodiment because the aluminum oxide is etched only when the HF gas 200 is provided into the deposition chamber. In addition, the etching rate of the aluminum oxide can be adjusted by controlling a flow time of the HF gas 200 and a flow period of the HF gas 200.

Embodiment 4

Figure 6:
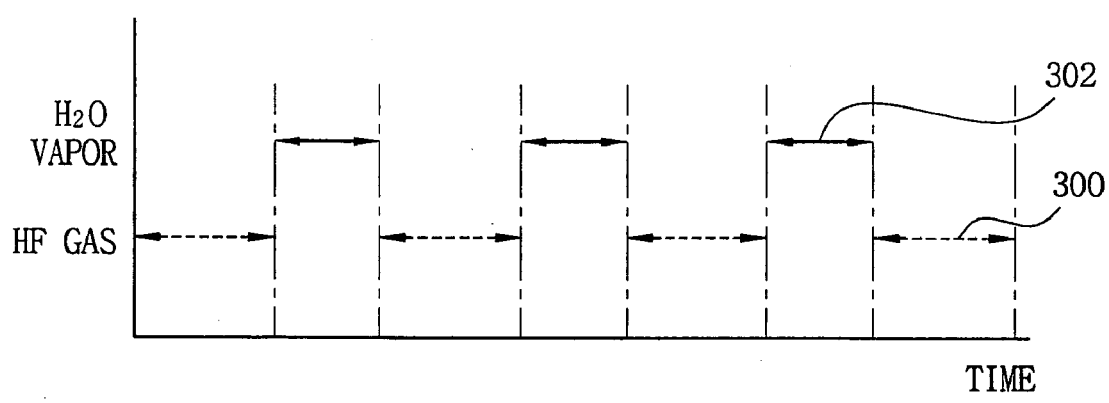
FIG. 6 is a graph illustrating flow rates of a fluorine-containing gas and water vapor that flow into a deposition chamber during a method for cleaning the deposition chamber according to a fourth embodiment of the present invention.

FIG. 6 is a graph illustrating flow rates of a fluorine-containing gas and a water vapor that flow into a deposition chamber during a method for cleaning the deposition chamber according to a fourth embodiment of the present invention.

Referring to FIG. 6, a fluorine-containing gas is provided into a deposition chamber in which a material including aluminum oxide is deposited. The fluorine-containing gas includes a hydrogen fluoride gas (HF), a fluorine gas ($F_2$), or a sulfur hexafluoride gas ($SF_6$). This embodiment will be explained with the fluorine-containing gas as an HF gas 300, however, any of the above mentioned gases might be used.

When a solid-phased aluminum fluoride is formed in accordance with a reaction between the aluminum oxide and the HF gas 300, a water vapor 302 is introduced into the deposition chamber while a supply of the HF gas 300 is stopped. The water vapor 302 decomposes the aluminum fluoride formed in the deposition chamber, and then the decomposed aluminum fluoride is exhausted from the deposition chamber by a pumping process.

When the water vapor 302 is not provided into the deposition chamber, the HF gas 300 is provided into the deposition chamber again and is reacted with the aluminum oxide to generate the solid-phased aluminum fluoride. When the supply of the HF gas 300 is stopped, the water vapor 302 is introduced into the deposition chamber to decompose the aluminum fluoride. Then, the decomposed aluminum fluoride is exhausted from the deposition chamber by a pumping process. This alternative gas introduction process continues until the chamber is cleaned.

When the HF gas 300 and the water vapor 302 are alternatively introduced into the deposition chamber, the aluminum fluoride is generated when the HF gas 300 only is introduced, and the aluminum fluoride is decomposed when the water vapor 302 only is introduced. Thus, an etching rate of the aluminum oxide may be lower than that of the first embodiment, the second embodiment, and the third embodiment.

The above-described methods for cleaning a deposition chamber can be employed for various deposition apparatuses, including showerhead type deposition apparatuses and a gas flow type deposition apparatuses.

Hereinafter, a deposition apparatuses for performing in situ cleaning will be described with reference to FIGS. 7 to 10.

Figure 7:
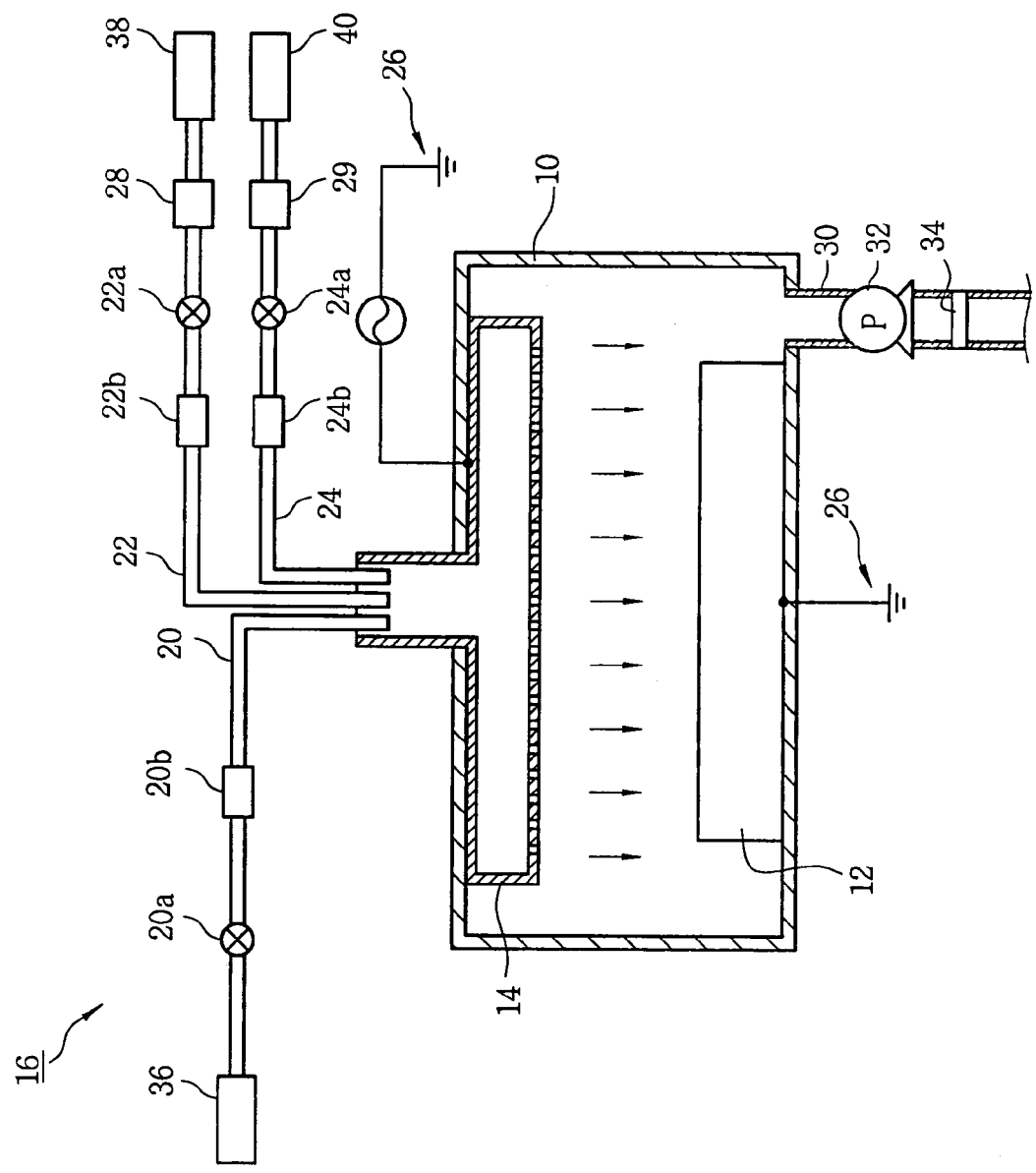
FIG. 7 is a schematic cross-sectional view illustrating a showerhead type deposition apparatus according to one embodiment of the present invention.

FIG. 7 is a schematic cross-sectional view illustrating a showerhead type deposition apparatus according to one embodiment of the present invention.

Referring to FIG. 7, a showerhead type deposition apparatus includes a chamber 10 in which a deposition process is performed. A chuck 12 for loading a wafer (not shown) is installed on a bottom of the chamber 10. A showerhead 14 is disposed at an upper portion of the chamber 10. Both deposition gases for film formation and cleaning gases for cleaning the chamber 10 flow into the chamber 10 through the showerhead 14. A gas supply member 16 is connected to the showerhead 14 to provide the deposition gas and the cleaning gases into the chamber 10.

The gas supply member 16 includes a deposition gas supply line 20 and cleaning gas supply lines 22 and 24. The deposition gas for formation of the film on the wafer is provided through the deposition gas supply line 20. The cleaning gases for cleaning reacting residues and reaction by-products, attached in the chamber 10, flow into the chamber 10 through the cleaning gas supply lines 22 and 24. The deposition gas supply line 20 can include more than one line as circumstances demand.

The showerhead 14 includes a plurality of gas spray holes (not shown). Some gas spray holes are connected to the deposition gas supply line 20 while other gas spray holes are connected to the cleaning gas supply lines 22 and 24. Thus, the deposition gas and the cleaning gases are separately provided through the gas spray holes.

The deposition gas supply line 20 and the cleaning gas supply lines 22 and 24 are connected to a deposition gas source 36 and cleaning gas sources 38 and 40, respectively. To open and shut flows of the deposition gas and the cleaning gases, valves 20a, 22a and 24a are installed in the deposition gas supply line 20 and the cleaning gas supply lines 22 and 24. In addition, controllers 20b, 22b and 24b are installed in the deposition gas supply line 20 and the cleaning gas supply lines 22 and 24 in order to control a flow rate of the deposition gas and flow rates of the cleaning gases, respectively. For example, the cleaning gases provided through the cleaning gas supply lines 22 and 24 include a hydrogen fluoride gas and water vapor.

The cleaning gas supply lines 22 and 24 are connected to the cleaning gas sources 38 and 40 and are extended into the showerhead 14, where they are then provided into the chamber 10.

A plasma generating member 26 is coupled to the chuck 12 and the showerhead 14, and supplies radio frequency power to generate a plasma in the chamber 10. Remote plasma devices 28 and 29 are connected to the cleaning gas supply lines 22 and 24, respectively, and excite the cleaning gases outside the chamber for etching the reaction residues and by-products attached in the chamber 10.

An exhaust line 30 is connected to the chamber 10 in order to exhaust un-reacted gases and floating gases generated in the chamber 10. The un-reacted gases and the floating gases are exhausted from the chamber 10 by a pumping process. A pump 32 and a scrubber 34 are installed in the exhaust line 30. The pump 32 exhausts the gases in the chamber 10 and the scrubber 34 filters the gases in the chamber 10. The exhaust line 30 is preferably composed of stainless steel coated by a fluoric resin in order to minimize the corrosion of the exhaust line 30 because the corrosive cleaning gases that are introduced into the chamber 10 may corrode the stainless steel. When the exhaust line 30, including the stainless steel, is corroded, the operation efficiency of the pump 32 is reduced so that harmful gases, for example, $Al(CH_3)$ that is a source of aluminum, may be leaked from the deposition apparatus. When the exhaust line 30 including the stainless steel becomes corroded, it is preferably replaced with a new one in order to prevent leakages of the harmful gases from the deposition apparatus.

Figure 8:
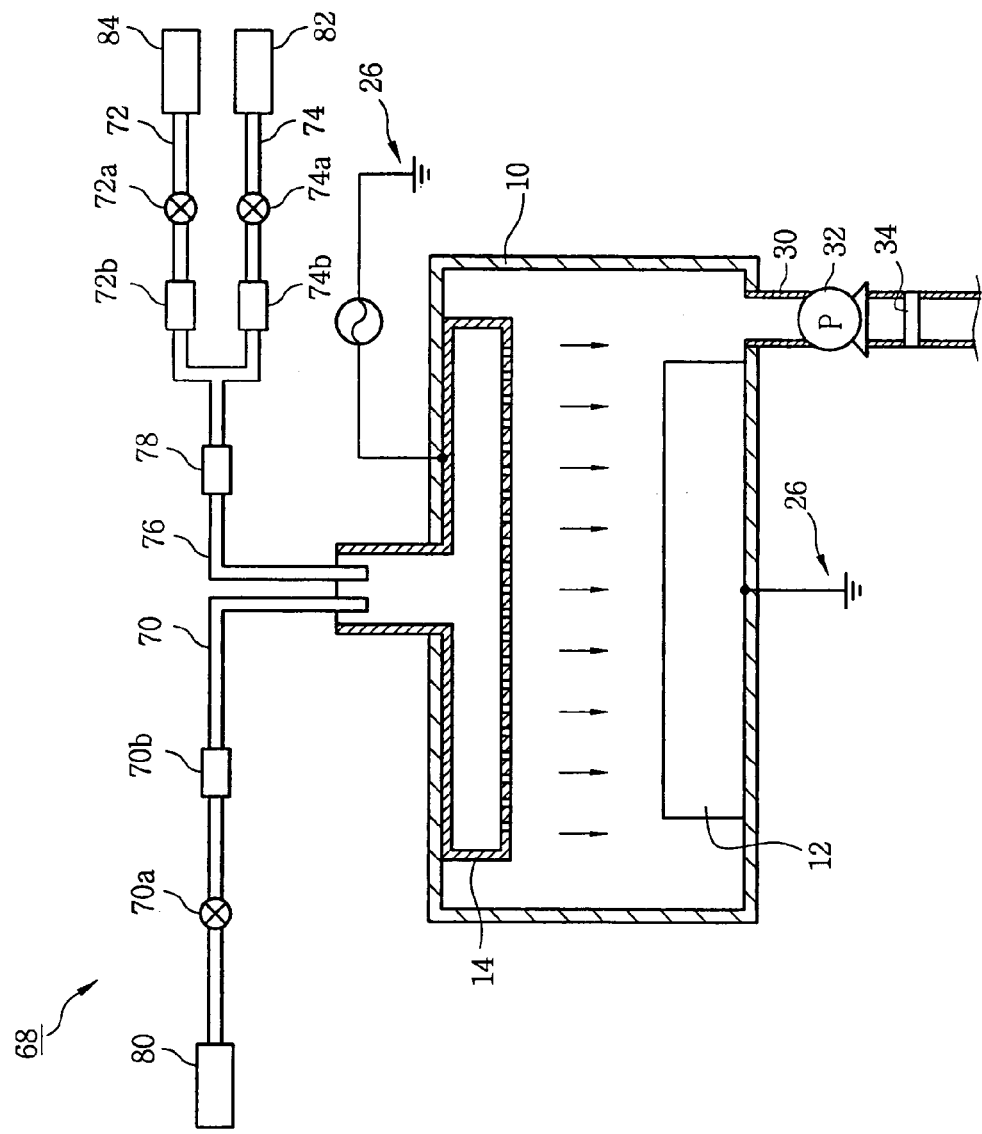
FIG. 8 is a schematic cross-sectional view illustrating a showerhead type deposition apparatus according to another embodiment of the present invention.

FIG. 8 is a schematic cross-sectional view illustrating a showerhead type deposition apparatus according to another embodiment of the present invention. In FIG. 8, the showerhead type deposition apparatus of the present embodiment includes a gas supply member 68 with a different configuration from that of the deposition apparatus shown in FIG. 7. Other elements of the deposition apparatus of the present embodiment are identical or similar to those of the deposition apparatus shown in FIG. 7.

Referring to FIG. 8, the gas supply member 68 has a deposition gas supply line 70 and cleaning gas supply lines 72 and 74. A deposition gas is introduced into a chamber 10 through the deposition gas line 70 to form a film on a wafer loaded on a chuck 12. Cleaning gases are provided into the chamber 10 through the cleaning gas supply lines 72 and 74 to clean reaction residues and by-products attached in the chamber 10. The deposition gas supply line 70 and the cleaning gas supply lines 72 and 74 are connected to a deposition gas source 80, and cleaning gas sources 82 and 84, respectively. However, in this embodiment, the cleaning gas supply lines 72 and 74 are integrated into one line 76, which is then connected to the showerhead 14. Therefore, after the cleaning gases are mixed in the integrated line 76, the mixed cleaning gases are provided into the chamber 10 through the showerhead 14.

Valves 70a, 72a and 74a are installed in the deposition gas supply line 70 and the cleaning gas supply lines 72 and 74 to open and shut flows of the deposition gas and the cleaning gases, respectively. Additionally, controllers 70a, 72b and 74b are installed at the deposition gas supply line 70 and the cleaning gas supply lines 72 and 74 in order to adjust the flow rates of the deposition gas and the cleaning gases, respectively.

A remote plasma device 78 is disposed in the integrated line 76 of the cleaning gas supply lines 72 and 74. The remote plasma device 78 excites the mixed cleaning gases outside of the chamber 10, and provides the chamber 10 with the excited cleaning gases.

The showerhead 14 has a plurality of gas spray holes (not shown). Some gas spray holes are connected to the deposition gas supply line 70 and the other gas spray holes are connected to the cleaning gas supply lines 72 and 74. Thus, the deposition gas and the cleaning gases can be separately provided into the chamber 10 through the gas spray holes of the showerhead 14.

Figure 9:
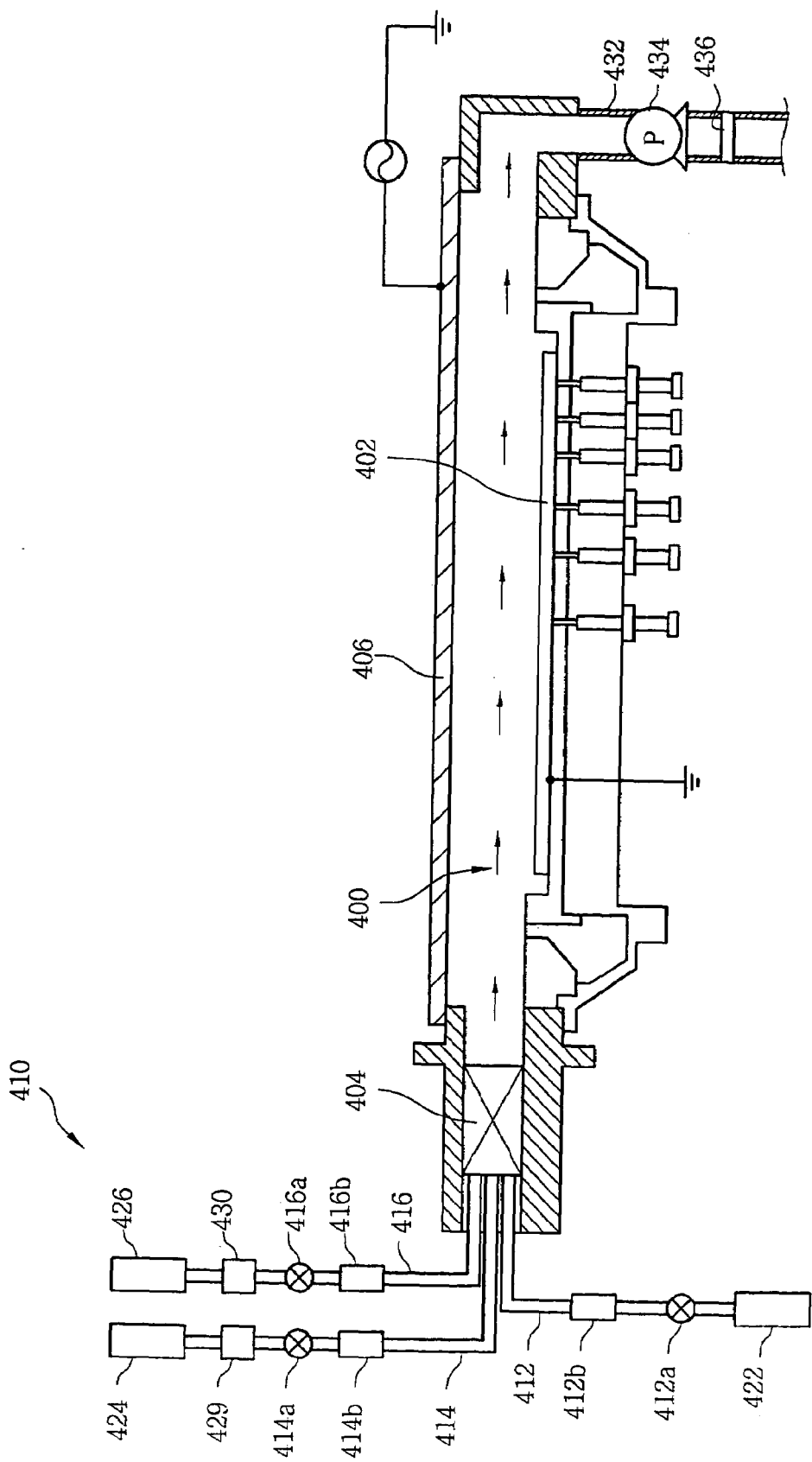
FIG. 9 is a schematic cross-sectional view illustrating a gas flow type deposition apparatus according to yet another embodiment of the present invention.

FIG. 9 is a schematic cross-sectional view illustrating a gas flow type deposition apparatus according to yet another embodiment of the present invention.

Referring to FIG. 9, the gas flow type deposition apparatus of the present embodiment includes a chamber 400 for performing a deposition process. A chuck 402, for loading wafers (not shown), is disposed on a bottom of the chamber 400. The chuck 402 also functions as a bottom electrode for forming plasmas in the chamber. 400.

A gas injector 404 is disposed in one portion of the chamber 400. The gas injector 404 injects a deposition gas and cleaning gases along a predetermined direction in the chamber 400. Therefore, the deposition gas and the cleaning gases are introduced into the chamber 400 through the gas injector 404. A top electrode 406 corresponding to the chuck 402 is disposed at an upper portion of the chamber 400 to generate the plasmas in the chamber 400.

A gas supply member 410 is coupled to the gas injector 404 to provide the deposition gas and the cleaning gases into the chamber 400. The deposition gas forms a film on the wafer loaded on the chuck 402, and the cleaning gases remove reacting residues and reaction by-products attached in the chamber 400. The gas supply member 410 includes a deposition gas supply line 412 and cleaning gas supply lines 414 and 416. The deposition gas is provided into the chamber 400 through the deposition gas supply line 412, and the cleaning gases are introduced into the chamber 400 through the cleaning gas supply lines 414 and 416. The deposition gas supply line 412 and the cleaning gas supply lines 414 and 416 are connected to a deposition gas source 422 and cleaning gas sources 424 and 426, respectively. To open and shut flows of the deposition gas and the cleaning gases, valves 412*a*, 414*a* and 416*a* can be installed at the deposition gas supply line 412 and the cleaning gas supply lines 414 and 416, respectively. Controllers 412*b*, 414*b* and 416*b* can be additionally disposed at the deposition gas supply line 412 and the cleaning gas supply lines 414 and 416 so as to control flow rates of the deposition gas and the cleaning gases, respectively.

The cleaning gas supply lines 414 and 416 are connected from the cleaning gas sources 424 and 426 to the gas injector 404, where they are provided to the chamber 400.

Remote plasma devices 429 and 430 are coupled to the cleaning gas supply lines 414 and 416, respectively. The remote plasma devices 429 and 430 excite the cleaning gases outside the chamber for etching the reaction residues and by-products attached in the chamber 400.

An exhaust line 432 corresponding to the gas injector 404 is connected to the other portion of the chamber 400 to remove un-reacted gases and floating gases in the chamber 400. A pump 434 and a scrubber 436 are installed in the exhaust line 432. The pump 434 exhausts the gases in the chamber 400 by a pumping process, and the scrubber 436 filters the gases exhausted from the chamber 400. The exhaust line 432 is advantageously composed of stainless steel coated by a fluoric resin.

FIG. 10 is a schematic cross-sectional view illustrating a gas flow type deposition apparatus according to still another embodiment of the present invention. In FIG. 10, the deposition apparatus of the present embodiment has a gas supply member 510 with a configuration that is different from that of the deposition apparatus shown in FIG. 9. However, other elements of the deposition apparatus of the present embodiment are identical or similar to those of the deposition apparatus in FIG. 9.

Referring to FIG. 10, the gas flow type deposition apparatus of the present embodiment includes a gas supply member 510 coupled to a gas injector 404 to provide a deposition gas and cleaning gases into a chamber 400. The deposition gas forms a film on a wafer loaded on a chuck 402 and the cleaning gases remove reacting residues and reaction by-products attached in the chamber 400.

The gas supply member 510 has a deposition gas supply line 512 for providing the deposition gas and cleaning gas supply lines 514 and 516 for providing the cleaning gases. The deposition gas supply line 512 and the cleaning gas supply lines 514 and 516 are connected to a deposition gas source 522 and cleaning gas sources 524 and 526, respectively. To open and shut flows of the deposition gas and the cleaning gases, valves 512*a*, 514*a* and 516*a* can be installed at the deposition gas supply line 512 and the cleaning gas supply lines 514 and 516, respectively. In addition, controllers 512*b*, 514*b* and 516*b* can be disposed at the deposition gas supply line 512 and the cleaning gas supply lines 514 and 516 to control flow rates of the deposition gas and the cleaning gases, respectively.

The cleaning gas supply lines 514 and 516 are integrated to form one integrated line 528, and the integrated line 528 is connected to the chamber 400. Thus, the cleaning gases are mixed in the integrated line 528, and then the mixed cleaning gases are introduced into the chamber 400.

A remote plasma device 530 is coupled to the integrated line 528 of the cleaning gas supply lines 514 and 516. The remote plasma device 430 excites the cleaning gases outside the chamber for etching the reaction residues and by-products attached in the chamber 400.

When a film is formed on a wafer using the above-described deposition apparatus, reacting residues attached in a deposition chamber can be removed from the deposition chamber by cleaning gases provided into the deposition chamber through cleaning gas supply lines. Therefore, metal oxides deposited on an inside or elements of the deposition chamber can be cleaned in situ without a separation of the deposition chamber from the deposition apparatus.

This is accomplished by reacting a first cleaning gas with the metal oxides attached in the deposition chamber to generate solid-phased residues. Then, a second cleaning gas decomposes the solid-phased residues. The decomposed residue is finally exhausted out of the chamber through an exhaust line. As a result, the metal oxides in the deposition chamber are rapidly etched and the deposition chamber is cleaned in a very short time.

Having described the preferred embodiments of the present invention, it is noted that modifications and variations can be made by persons skilled in the art in light of the above teachings. It is therefore to be understood that changes and variations may be made to the described embodiments of the present invention disclosed which fall within the scope and the spirit of the invention as outlined by the appended claims.

What is claimed is:

1. A method for cleaning a chamber, the method comprising:

providing a first gas into a chamber having a metal oxide attached therein, the first gas being a gas which reacts with a metal included in the metal oxide to generate a reacting residue, wherein the chamber does not contain a plasma;

providing a second gas into the chamber, the second gas being a gas which decomposes the reacting residue, wherein the second as includes water ($H_2O$) vapor; and removing the decomposed reacting residue from the chamber, whereby the metal oxide is removed from the chamber.

2. The method of claim 1, wherein the first gas includes a fluorine-containing gas.

3. The method of claim 2, wherein the fluorine-containing gas includes a hydrogen fluoride (HF) gas, a fluorine ($F_2$) gas, or a sulfur hexafluoride ($SF_6$) gas.

4. The method of claim 1, further comprising exciting the first gas and the second gas outside of the chamber before providing the first gas and the second gas into the chamber.

5. The method of claim 1, wherein the chamber has a temperature of about 50 to about 650° C.

6. The method of claim 1, wherein the chamber has a pressure of about 0.1 to about 100 Torr.

7. The method of claim 1, wherein the metal oxide includes aluminum oxide ($Al_2O_3$).

8. The method of claim 1, wherein the first gas and the second gas are concurrently provided into the chamber through separate gas supply lines.

9. The method of claim 1, wherein the first gas and the second gas are mixed in one gas supply line and are concurrently provided into the chamber.

10. The method of claim 1, wherein providing the first gas and the second gas further comprises:
providing the first gas into the chamber for a predetermined time; and
periodically providing the second gas into the chamber during the same time that the first gas is provided.

11. The method of claim 1, wherein providing the first gas and the second gas further comprises:
providing the second gas into the chamber; and
periodically providing the first gas into the chamber during the same time that the second gas is provided.

12. The method of claim 1, wherein the first gas and the second gas are alternatively provided into the chamber.

13. A method for cleaning a chamber, the method comprising:
providing a fluorine-containing gas and a water vapor into a chamber including a metal oxide attached therein, wherein the fluorine-containing gas is reacted with a metal included in the metal oxide to generate reacting residues and the water vapor decomposes the reacting residues, and wherein at least one of the fluorine-containing gas and the water vapor is continuously flowed into the chamber during a cleaning process while maintaining the chamber at a pressure between 0.1 Torr and about 100 Torr;
whereby the metal oxide is removed from the chamber by reacting the metal oxide with the fluorine-containing gas and the water vapor.

14. The method of claim 13, wherein providing the fluorine-containing gas and the water vapor further comprises:
providing the fluorine-containing gas into the chamber; and
periodically providing the water vapor into the chamber during the same time that the fluorine-containing gas is provided.

15. The method of claim 13, wherein providing the fluorine-containing gas and the water vapor further comprises:
providing the water vapor into the chamber; and
periodically providing the fluorine-containing gas into the chamber during the same time that the water vapor is provided.

16. A method for cleaning a chamber, the method comprising:
alternatively providing a fluorine-containing gas and a water vapor into a chamber including a metal oxide attached therein, wherein the fluorine-containing gas is reacted with a metal included in the metal oxide while maintaining the chamber at a pressure between 0.1 Torr and about 100 Torr to generate reacting residues and the water vapor decomposes the reacting residues; and
removing the metal oxide from the chamber by reacting the metal oxide with the fluorine-containing gas and the water vapor.

17. A method for cleaning a chamber, the method comprising:
providing a first gas and a second gas into a chamber with metal oxide attached therein, wherein the chamber does not contain a plasma;
reacting the first gas with a metal included in the metal oxide to generate a reacting residue;
decomposing the reacting residue with the second gas, wherein the second gas includes water $H_2O$) vapor; and
removing the decomposed reacting residue through an exhaust line.

18. The method of claim 17, wherein the first gas includes a fluorine-containing gas.

19. A method for cleaning a chamber, the method comprising:
providing a first gas into a chamber having a metal oxide attached to an inside surface thereof, the first gas being a gas which reacts with a metal included in the metal oxide to generate a reacting residue, wherein the chamber does not contain a plasma;
providing a second gas into the chamber, the second gas being a gas which decomposes the reacting residue, wherein the second gas includes water ($H_2O$) vapor; and
removing the decomposed reacting residue from the chamber.

20. A method for cleaning a chamber, the method comprising:
maintaining a pressure in a chamber having a metal oxide attached therein between 0.1 Torr and about 100 Torr;
providing a first gas into the chamber, the first gas being a gas which reacts with a metal included in the metal oxide to generate a reacting residue, wherein the chamber does not contain a plasma;
providing a second gas into the chamber, the second gas being a gas which decomposes the reacting residue, wherein the second gas includes water ($H_2O$) vapor; and
removing the decomposed reacting residue from the chamber,
whereby the metal oxide is removed from the chamber.

21. A method for cleaning a chamber, the method comprising:
providing a first gas into a chamber having a metal oxide attached therein, the first gas being a gas which reacts with a metal included in the metal oxide to generate a reacting residue, wherein the chamber does not contain a plasma;
providing a second gas into the chamber, the second gas being a gas which decomposes the reacting residue; and
providing at least one additional gas selected of a nitric acid ($HNO_3$) gas and an alcohol-containing gas into the chamber, the additional gas diluting the first and second gases to reduce the removal rate of the metal oxide; and
removing the decomposed reacting residue from the chamber,
whereby the metal oxide is removed from the chamber.

* * * * *

UNITED STATES PATENT AND TRADEMARK OFFICE
CERTIFICATE OF CORRECTION

PATENT NO. : 7,201,807 B2 Page 1 of 1
APPLICATION NO. : 10/734479
DATED : April 10, 2007
INVENTOR(S) : Eun-Taek Yim et al.

It is certified that error appears in the above-identified patent and that said Letters Patent is hereby corrected as shown below:

Column 12, line 64, the words "second as" should read -- second gas --;

Column 14, line 17, the words "water H₂O)" should read -- water (H₂O) --.

Signed and Sealed this

Fifth Day of August, 2008

JON W. DUDAS
*Director of the United States Patent and Trademark Office*